(12) United States Patent
Bansal

(10) Patent No.: US 6,765,245 B2
(45) Date of Patent: Jul. 20, 2004

(54) GATE ARRAY CORE CELL FOR VLSI ASIC DEVICES

(75) Inventor: Jai P. Bansal, Manassas, VA (US)

(73) Assignee: Bae Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 10/325,030

(22) Filed: Dec. 19, 2002

(65) Prior Publication Data
US 2003/0178648 A1 Sep. 25, 2003

Related U.S. Application Data

(60) Provisional application No. 60/367,429, filed on Mar. 25, 2002.

(51) Int. Cl.[7] .............................................. H01L 27/10
(52) U.S. Cl. ...................... 257/202; 257/204; 257/206; 257/207; 257/210; 257/909; 438/128; 438/587; 438/598
(58) Field of Search ........................ 257/202–211, 909; 438/128, 587, 598

(56) References Cited

U.S. PATENT DOCUMENTS

| | | | | |
|---|---|---|---|---|
| 4,851,892 A | * | 7/1989 | Anderson et al. ............ | 257/206 |
| 5,038,192 A | * | 8/1991 | Bonneau et al. ............. | 257/206 |
| 5,384,472 A | * | 1/1995 | Yin ............................ | 257/204 |
| 5,404,034 A | * | 4/1995 | Yin ............................ | 257/206 |
| 5,452,245 A | * | 9/1995 | Hickman et al. ............ | 365/154 |
| 5,493,135 A | * | 2/1996 | Yin ............................ | 257/204 |
| 5,701,021 A | * | 12/1997 | Yin ............................ | 257/208 |
| 6,097,042 A | * | 8/2000 | Lee ............................ | 257/204 |
| 6,445,065 B1 | * | 9/2002 | Gheewala et al. .......... | 257/691 |

* cited by examiner

Primary Examiner—David Nelms
Assistant Examiner—Andy Huynh
(74) Attorney, Agent, or Firm—Daniel J. Long (57) ABSTRACT

A very efficient gate array core cell in which the base core cell consists of a group of 6 PMOS transistors and a group of 6 NMOS transistors. It also includes pre-wiring of 2 of the 6 PMOS transistors, with 2 of the 6 NMOS transistors at polysilicon level or at local interconnect level while leaving the remaining PMOS and NMOS transistors as individual transistors to be interconnected during the functional ASIC metallization process. The core cell also has 2 polysilicon or local interconnect wires embedded in it, which can be used to interconnect transistors for logic function implementation. The core cell defined in this invention is highly flexible and has been analyzed to interconnect all types of logic and memory functions needed for ASIC designs. The layout of the transistors, pre-wiring of the strategic transistors at polysilicon level or at local interconnect level, and embedded polysilicon or local interconnect wires reduce the core cell size significantly. This core cell design reduces the overall wiring lengths, parasitic capacitance, which in turn reduce delays, power dissipation and increase ASIC performance and circuit density. Gate array ASIC components designed using this core cell provide circuit density, performance and power dissipation characteristics comparable to the Standard Cell ASICs but with the advantage of reducing the mask cost and processing time by about 50 percent.

20 Claims, 13 Drawing Sheets

GATE ARRAY CORE CELL FOR VLSI ASIC DEVICES

CROSS REFERENCE TO RELATED APPLICATION

This application claims rights under U.S. Provisional Patent Application Serial No. 60/367,429 filed Mar. 25, 2002.

BACKGROUND OF THE INVENTION

1. Field of the Invention

This invention describes the design and layout of a basic core cell of gate array ASIC device. It relates to the technique of arranging the complimentary metal oxide semiconductor (here after referred to as CMOS) structures such as source / drain diffusion regions, gate oxide regions, contact holes, polysilicon, and metal electrodes. In particular it relates to the significant increase in circuit density, performance and decrease in circuit delays and power dissipation, this core cell offers over the prior art of gate array core cells used in ASIC devices. In addition to the CMOS process, this core cell design is equally applicable to gate array devices in the Silicon on Insulator (SOI) and BI-CMOS technologies. The gate array core cell design is independent of process design dimensions.

2. Brief Description of Prior Developments

Figure 12:
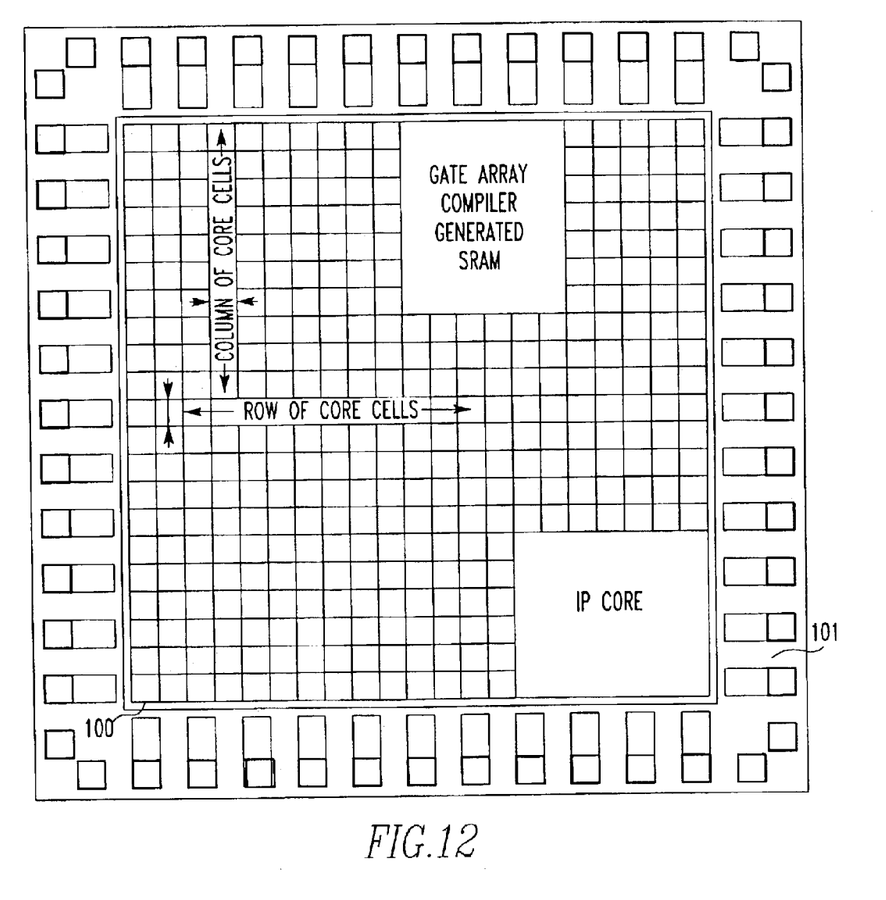
FIG. 12 is the top view of an ASIC which shows the Core area and Input/Output Buffer area and also shows how Gate Array compiler generated SRAM and an IP Core can be implemented in the ASIC layout.

A VLSI ASIC device requires large number of transistors, exceeding 20 million in some of the sub-micron ASICs on a single chip. A gate array master slice chip is illustrated in FIG. 12. It consists of an array of identical core cells occupying a major portion of the chip in the center and one row of primary input output buffer cells along the periphery of the chip. The core cell consists of predefined number of PMOS and NMOS transistors and the layout arrangement of these transistors. Formation of PMOS and NMOS transistors is a well-known prior art. Each transistor has a source and a drain diffusion region (here after referred to as "S/D") separated by the transistor channel. The channel is covered by thin oxide and the thin oxide is covered by polysilicon gate electrode. The function of S/D regions is interchangeable. Also in many layouts, two transistors may have a common source or drain region.

A gate array masterslice does not contain any predefined functional interconnections of the transistors. The masterslice wafers are only processed up to the formation of the self aligned polysilicon gate electrodes, in some cases as in this invention, polysilicon wire structures over thick oxide, and S/D regions. Many different ASIC components can be fabricated using the same gate array masterslice wafers. It is only during the process of each unique ASIC component that the transistors in the core cells and input/output buffer cells are interconnected to form various logic functions such as inverters, NANDs, NORs, ADDERS, LATCHES, receiver buffers, driver buffers, etc. Simultaneously the interconnections between the logic functions are formed to complete the ASIC component fabrications.

As the gate array masterslice is common to many unique gate array ASIC components, one mask-set is needed to process wafers up to the S/D formation steps. These process steps are also known as front end of the line (FEOL) steps. A large number of wafers are processed through the FEOL process and are kept in stock. Individual gate array ASIC components use master slice wafers from the stock thereby eliminating the FEOL processing time and cost of unique FEOL masks, as is the case for standard cell ASIC components. Each gate array ASIC requires a unique metal interconnection mask set also known as the back end of the line (BEOL) mask set.

The important characteristics of an ASIC component such as circuit density, performance, and power dissipation are directly dependent on the design of the core cell. It will be explained in details that the core cell presented in this invention offers significant improvements in the above mentioned characteristics over the gate array core cell designs in the prior art.

Figure 1A:
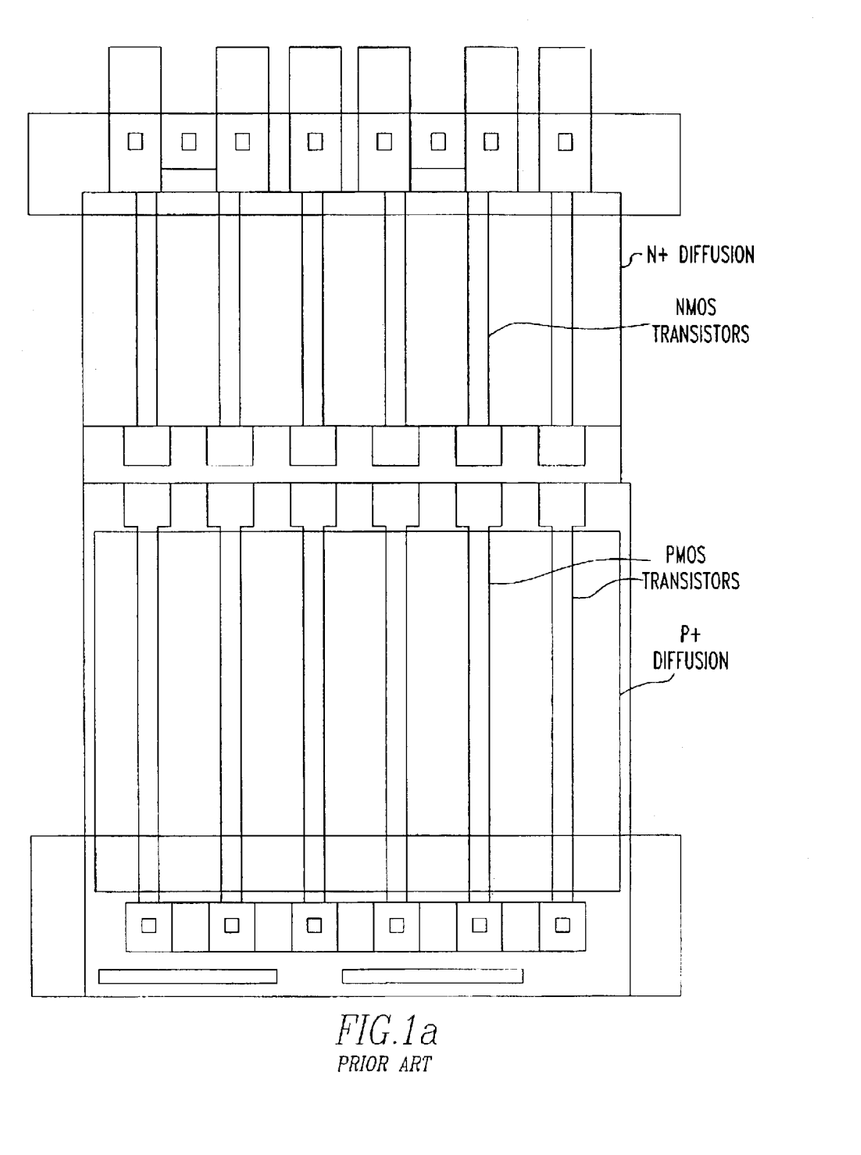
FIG. 1a is a layout of the plurality of NMOS and PMOS transistors making up the gate array core cells in the prior art, wherein the transistors are arranged in continuous horizontal rows.
Figure 1B:
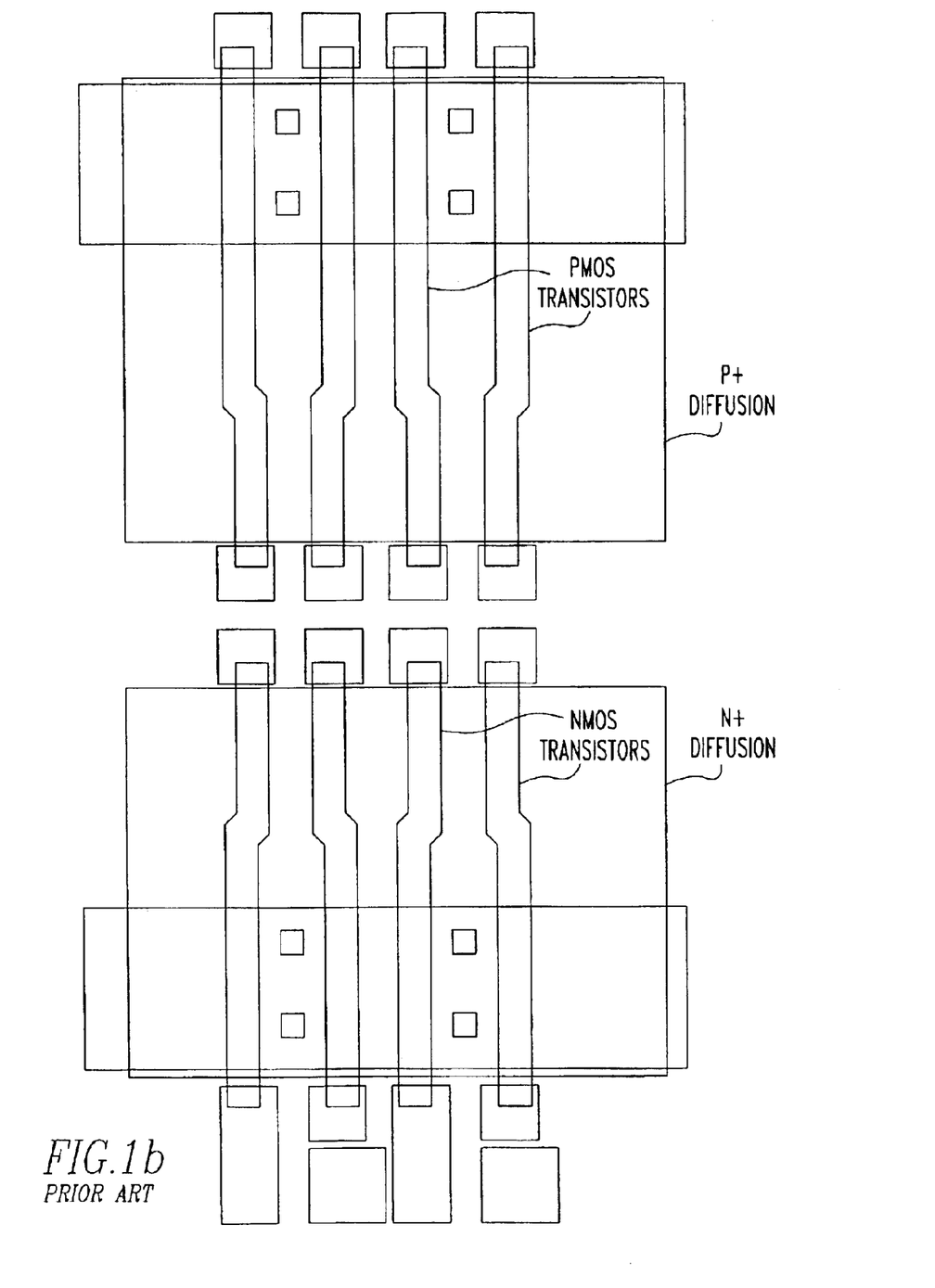
FIG. 1b is a layout of the plurality of NMOS and PMOS transistors making up the gate array core cells in the prior art, wherein the transistors are bent to provide slightly higher circuit density than can be obtained with the FIG. 1a configuration and the transistors are also arranged in continues horizontal rows.

There are several types of gate array core cells in the prior art. The simplest forms are shown in FIG. 1A and FIG. 1B, where PMOS and NMOS transistors are arranged in continuous rows. These transistors are interconnected to form digital logic functions. In this configuration a large number of transistors are used just to isolate one circuit output from another circuit output, reducing the ASIC circuit density significantly. Further more all transistors need to be interconnected at metal level or levels only, taking many interconnecting wiring tracks, specifically if the function has cross coupling feedback loops such as in the Flip Flop circuits. This increases the core cell area, parasitic capacitance, circuit delays, and power dissipation in the ASIC. Another type of gate array core cell in the prior art (layout not shown) art consists of a large number of transistors. Some of these transistors are used as pass transistors, some transistors are used for memory functions, and others form the logic functions. In ASICs designed with such core cells, a large percentage of transistors remain unused, thereby offering low circuit density at the ASIC chip level.

SUMMARY OF INVENTION

The present invention provides an optimum architecture of a gate array core cell. It can be used for efficient design of combinatorial logic cells such as NANDs, NORs, XORs, MUXs, data storage logic cells such as DFF, Flip Flops, and compiler based memory functions such as ROMs, SRAMs, dual port RAMs, and shift registers. The present invention essentially provides the means to design gate array ASICs with comparable circuit density, performance, and power dissipation to the standard cell ASICs while reducing the mask cost and ASIC component fabrication time to about half of the standard cell ASICs. The core cells include the following elements: (1) three P+ diffusion elements within one N-Well region. Each of these P+ diffusion regions contains two PMOS transistors. The N-Well region also includes a N+ diffusion region to connect the N-Well to the power supply (hereafter as VDD); (2) three N+ diffusion regions each of these N+ diffusion regions contain two NMOS transistors; (3) three N+ diffusion ESD diodes. All six PMOS transistors have the same width and length dimensions and similarly all six NMOS transistors are identical in width and length dimensions. Middle two PMOS transistor gate electrodes are connected to the middle two NMOS transistors in a cross coupled manner using polysilicon or local interconnect wires over a thick oxide region. The core cell also includes two polysilicon or local interconnect embedded wires. These wires when not used are shorted to the VDD and the GND buses. The usefulness of the predefined wiring of two of the PMOS transistors to two of the NMOS transistors and of the polysilicon embedded wires will become apparent in the detailed description of the invention. The core cell architecture has the defined location for the VDD and GND buses at metal level. It also has the defined location for the interconnecting wires to form the personality of the logic cell as well as for interconnections from logic cell to logic cell, in other words doing the interconnections for the complete ASIC function in the BEOL processing steps.

The core cell structures, S/D diffusion regions, transistor gate electrodes, polysilicon or local interconnect wires, N-Well to VDD diffusion region and the ESD diode diffusion regions are designed to accommodate contact holes for interconnections to the metal wires. Most of the wiring track locations at metal M1 are taken to form the personality of the basic logic cells leaving some metal M1 wiring tracks for logic cell to logic cell (global) interconnections. Metal M2 and metal M3 wires are used for global connections. Gate array compiled memory functions will also use some of the M2 wiring locations.

Circuit density of the gate array ASIC can be further improved using additional metal layers M4, M5 etc for global interconnections. BEOL processing steps are well known in the prior art of fabricating semiconductor components. These wafer fabrication steps include the formation of contacts to the diffusion regions and polysilicon regions deposition of metal layers separated by insulator layers, and connections between metal layers. The unique features and advantages of this invention over the prior art will be explained in the detailed description. Several commonly used logic circuits and their graphical layouts will be also described.

BRIEF DESCRIPTION OF THE DRAWINGS

The present invention is further described with reference to the accompanying drawings in which.

DETAILED DESCRIPTION OF THE PREFERRED EMBODIMENT

Gate Array Core Cell

Figure 2:
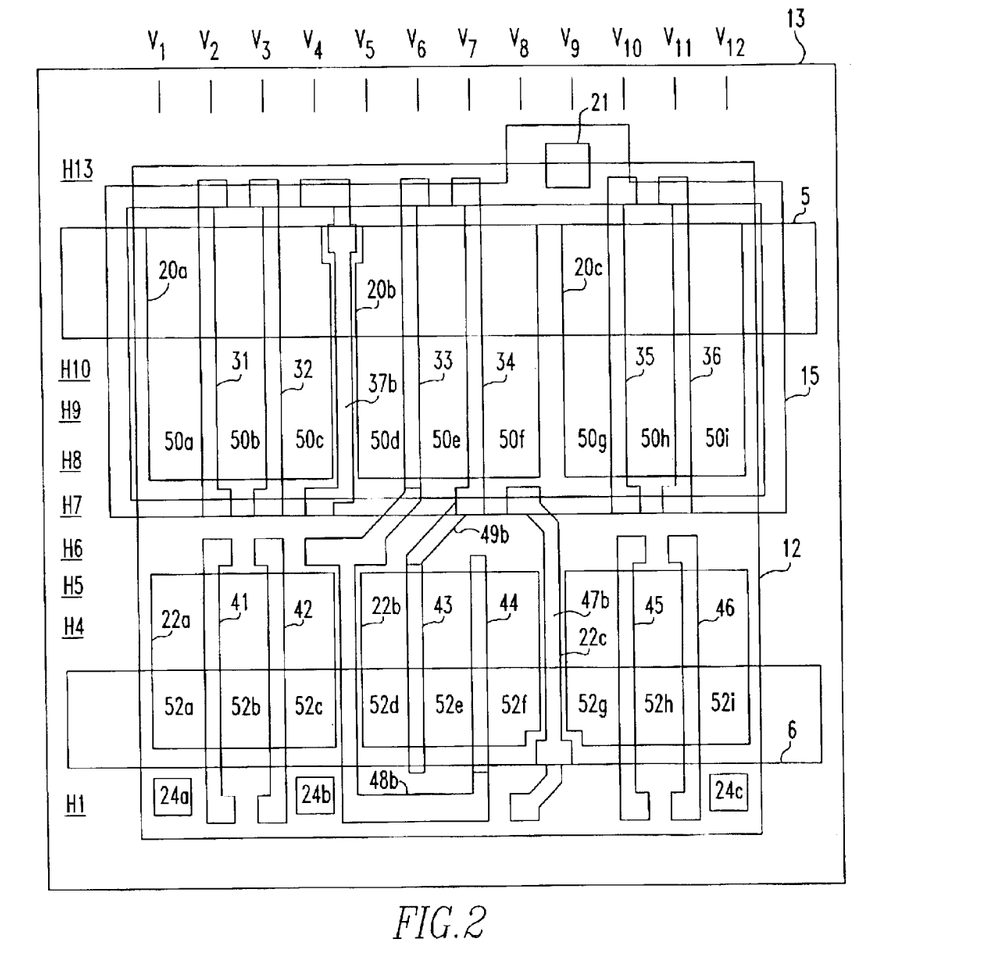
FIG. 2 illustrates the design of the Gate Array Core Cell of the present invention. The core cell has 6 PMOS and 6 NMOS transistors.

The architecture of the gate array core cell 12 is illustrated in FIG. 2, showing the process through transistors formation but before the contacts and metal interconnects between the transistors necessary for a logic function are added. The core cell includes the N-Well region 15, formed by N-Type Diffusion in a P type semiconductor substrate 13. Next the gate oxide is grown over the entire wafer and followed by the deposition of polysilicon, which is personalized to form regions, 31 to 36 for the PMOS transistors, 41 to 46 for the NMOS transistors, and polysilicon interconnects 37b, 47b, 48b, and 49b. Interconnect wires 37b, 47b, 48b, and 49b can also be formed at local interconnect level. Local interconnects will require one additional masking step. It will also provide added flexibility of using predefined wires only when needed in the Gate Array ASIC design. Here after these predefined wires will be mentioned only as polysilicon wires, with the understanding that the same can be replaced with local interconnect wires. Notice that PMOS transistor 33 is connected with NMOS transistor 44 via polysilicon interconnect wire 48b permanently and PMOS transistor 34 is permanently connected to NMOS transistor 43 with polysilicon wire 49b. One of the main features of this invention is the pre-wiring of some of the transistors at polysilicon level and leaving the other transistors to be interconnected at metal level, depending on the digital logic function to be performed in the gate array ASIC library. P-Type diffusion regions 20a, 20b, and 20c are formed within the N-Well region 15 to provide the source and drain regions 50a to 50i for the PMOS transistors 31 to 36. Region 50b is a common source or drain for transistors 31 and 32. Similarly region 50e is a common source or drain for transistors 33 and 34, and region 50h is a common source or drain for transistors 35 and 36. P-Type diffusion region 20b in the middle of P-type diffusion regions 20a and 20c is separated from regions 20a and 20c by the required diffusion to diffusion spacing. All PMOS transistors 31 to 36 are of the identical length and width dimensions. Polysilicon interconnect wires 37b, 47b, 48b, and 49b are over the thick oxide and do not have any active elements' characteristics. N-type region 21 within N-well 15 provides for a power supply connection to N-well. N-type diffusion regions 22a, 22b, and 22c are formed over the P-type substrate 13 to provide the source and drain regions 52a to 52i for the NMOS transistors 41 to 46. N-type diffusion regions 24a to 24c are means to provide ESD protection for the floating transistor gates which do not get connected to diffusion by metal during the wafer process. Region 52b is a common source or drain for transistors 41 and 42. Similarly N-type region 52e is a common source or drain for the transistors 43 and 44, and N-type region 52h is a common source or drain for the transistors 45 and 46. All NMOS transistors 41 to 46 have identical length and width dimensions. Ends of NMOS and PMOS transistor gate electrodes at polysilicon level, and polysilicon interconnect wires are widened to provide polysilicon area for the polysilicon to metal contacts, and polysilicon overlap over the contacts.

The core cell layout also shows the locations of the Power Supply (VDD) bus 5 at metal M1 level and Ground (GND) bus 6 at metal M1 level. The core cell is 13 Horizontal tracks (H1 to H13) high and 12 Vertical tracks (V1 to V12) wide. The electrical widths of PMOS transistors and or electrical widths of the NMOS transistors can be increased by stretching the height of the core cell along the H10 and or H4 horizontal tracks respectively. The increase in the electrical width of a transistor increases performance of the circuit. The middle part of the core cell, from H4 to H10 is essentially used to interconnect the transistors to make up the circuit function. This will be explained later in the individual circuit design description.

The arrangement of the pre-wired transistors 33, 34, 43, and 44 in the center, four not connected transistors 31, 32, 41, and 42 on the left side, and four not connected transistors 35, 36, 45, and 46 on the right side is very important in reducing the core cell size. This will become obvious later in the description of the logic circuits designed using this invention. The number of not connected transistors is also important in order to design memory cells as will be shown later in the design of a dual port SRAM cell. The not connected NMOS transistors are used as Write/Read Word Line pass transistors in the memory cell design. This gate array core cell provides pre-defined embedded polysilicon or local interconnect wires 37b and 47b. In many circuits such as D-Latch, XOR, Multiplexer, the output of the clock or select inverter needs to be connected to the input of some other transistors. In the circuits designed and described later, it will become apparent how these embedded wires reduce the requirement for metal line interconnects in many designs. That in turn reduces the cell size of the present invention.

Figure 3:
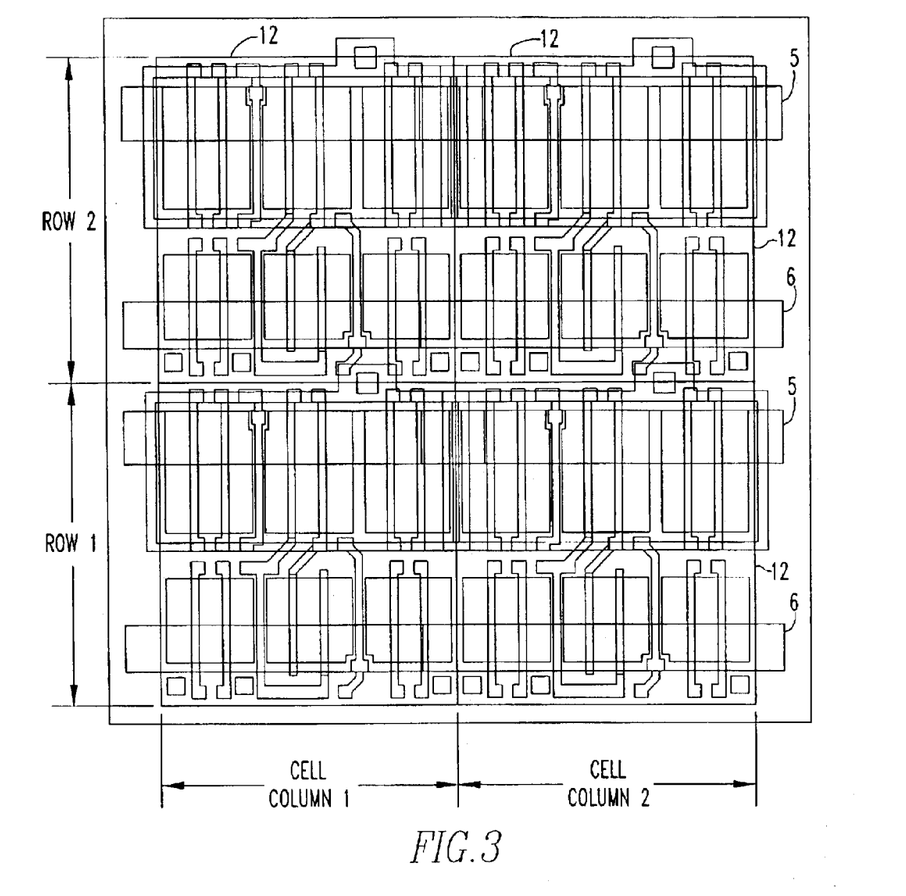
FIG. 3 is the top view of a 2×2 block of the gate array core cells of the present invention, which illustrates the formation of rows and columns of the of the core region of the semiconductor ASIC chip.

Implementation of some circuits may not require all the transistors in the core cell. In these circuit layouts, the PMOS transistor gate electrode will be shorted to the VDD bus as shown later in the Dual Port SRAM cell layout. Similarly NMOS transistor gate electrode will be shorted to the GND bus. This method will keep the not used transistors in the 'OFF' state and will avoid any reliability concern. Another method of keeping the not used transistors in the 'OFF' state is to connect the source and drain of the PMOS transistor to the VDD bus and source and drain of the NMOS transistor to the GND bus. This can be done with a contact from the respective S/D diffusion region to the VDD or GND bus electrodes on top of these regions. The core region of an ASIC consists of rows and columns of the Gate Array Core Cells. The cell boundary 12 butts against the boundary of the next cell in both horizontal and vertical directions. The method of making rows and columns of the Gate Array ASIC Core is illustrated in FIG. 3 with a 2×2 array block.

Circuits Designed Using the Core Cell

Figure 4:
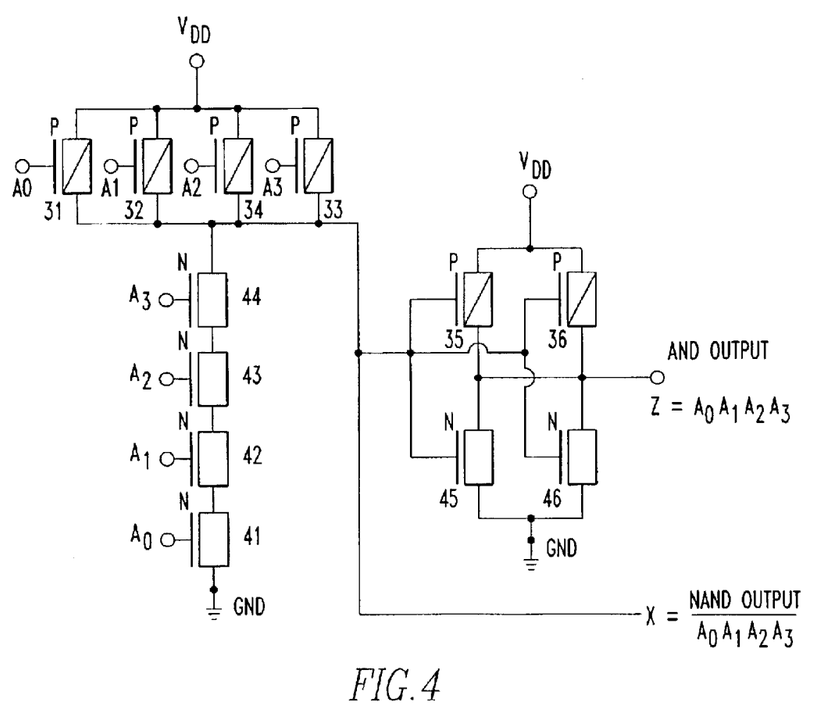
FIG. 4 is a transistor level circuit schematic of a NAND4/AND4 logic function.

A NAND4/AND4 (four input NAND/AND) Circuit is illustrated in FIG. 4. NAND function is built with the NMOS transistors 41, 42, 43, and 44, and PMOS transistors 31, 32, 33, and 34. The transistors are interconnected in a manner well known in the prior art to make a NAND function. Output 'X' of the NAND circuit also becomes the input of the inverter consisting of NMOS transistors 45 and 46, and PMOS transistors 35 and 36. By using two NMOS transistors in parallel and two PMOS transistors in parallel for the inverter, the driving strength of the inverter is increased. If the capacitive load at the output of the AND circuit is large, this feature for high performance is used. Output of the AND4 function is Z.

Figure 5:
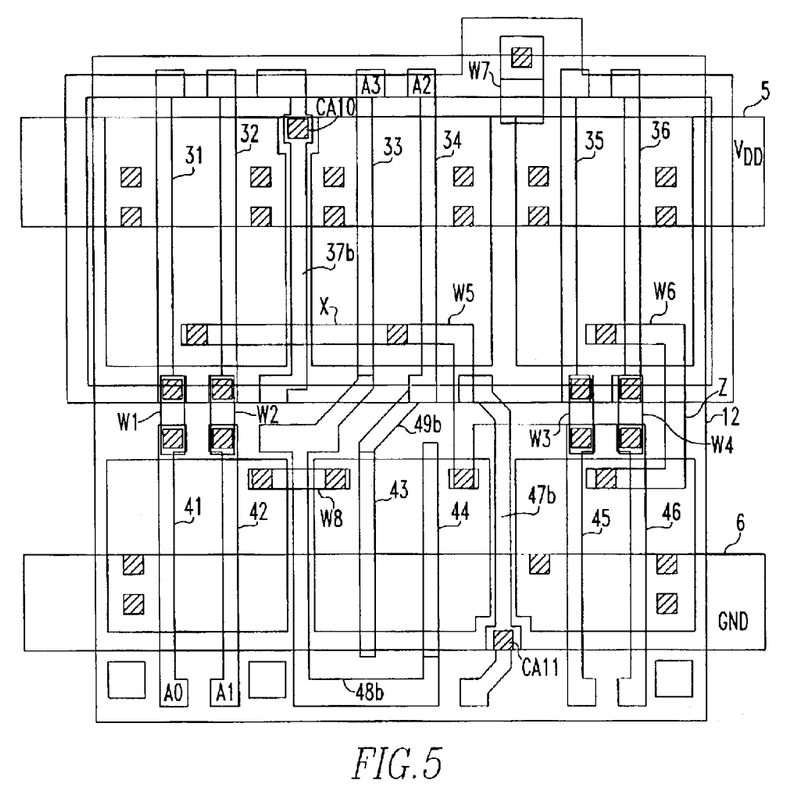
FIG. 5 is the NAND4/AND4 circuit layout using one gate array core cell of the present invention, wherein the layout shows the interconnections between transistors, and connections to power supply and ground buses.

FIG. 5 represents the layout of the four input NAND/AND circuit in FIG. 4. The PMOS transistors 31 to 36 and the NMOS transistors 41 to 46 are marked in the layout of the gate array cell. Interconnect wires w1, w2, w3, w4, w5, w6, and w7 are metal M1 conductors. Connections to the N-type diffusion, P-type diffusion and the polysilicon gates are made with the contacts represented by the shaded square shaped areas within the metal line wires. Ground connections to the sources of the NMOS transistors, 41, 45, and 46 are under the metal M1 Ground Bus 6 indicated in the layout as GND. Similarly the sources of the PMOS transistors 31 to 36 are under the metal M1 power supply bus 5 marked as VDD in the layout. The required sources of the transistors are connected to the VDD and GND buses as shown by the contacts under the respective VDD and GND buses.

NAND/AND inputs (outputs of other circuits in the ASIC) can be connected as follows: Input A0 at one of the 4 possible locations, A1 at one of the 4 possible locations, A2 at one of the two locations, and A3 at one of the possible 4 locations. Output 'Z' of the AND circuit will be on wire w6, anywhere at all possible vertical and horizontal wiring track crossing on wire w6. Similarly NAND output is on wire w4. Multiple choices for connecting inputs and outputs improve the ASIC wireability.

N-well 'NW' region is also connected to the power bus marked as the VDD bus in the layout, and the metal wire w7. It should be noted that P-type substrate of the wafer or die is continues for the whole area of the die and it is connected to ground normally by the substrate ring along the periphery or edge of the die. Since N-well regions may end up to be as island shapes on the die, all these N-well islands need to be connected to the power supply bus (Vdd) or biased to a known level in order to control the threshold voltage of the PMOS transistors. For NAND4/AND4 layout polysilicon wires 37b and 47b are not needed for interconnections. Wire 37b is shorted to VDD bus via contact CA10 and wire 47b is shorted to GND bus via contact CA11.

In a gate array ASIC N-well of one cell gets connected to the N-well of the next cell and forms a continuos N-well region for the whole row of cells. It is connected to the Vdd bus as often as ASIC wiring allows during the ASIC wiring. ESD Diodes D1, D2, and D3 are connected to the polysilicon gates whenever needed to satisfy the ESD requirements, governed by the wiring antenna rules of the technology process. If the total length of the wires between the polysilicon gate of the transistor to the nearest diffusion in the signal path of the net exceeds the defined limit, then one of these ESD diodes is connected to the polysilicon gate in that net by M1 wire. Therefore 3 diodes in each core cell region are sufficient to meet the antenna rules. An ESD diode will be connected within the net by metal M1.

Since the diode diffusion adds to the signal path net capacitance, it is not necessary to connect the diode in the net when the total metal length of the signal path does not exceed the limit for the antenna rules.

Another feature should be noted is that, the implementation of the 4 input NAND4/AND4 function uses only horizontal tracks H5 to H8 between the GND and VDD buses. Wiring tracks H4, H9, and H10 are available to do ASIC global wiring (circuit cell to circuit cell) at metal M1. The availability of M1 wiring tracks for global wiring improves the wireability of the ASIC and hence provides higher circuit density per unit area of the ASIC chip. The metal M1 wires and contacts needed for interconnections of this function make up the personality (Layout graphics data) of the NAND4/AND4 function. The personality graphics data is saved in the ASIC library under the NAND4/AND4 name.

Figure 6:
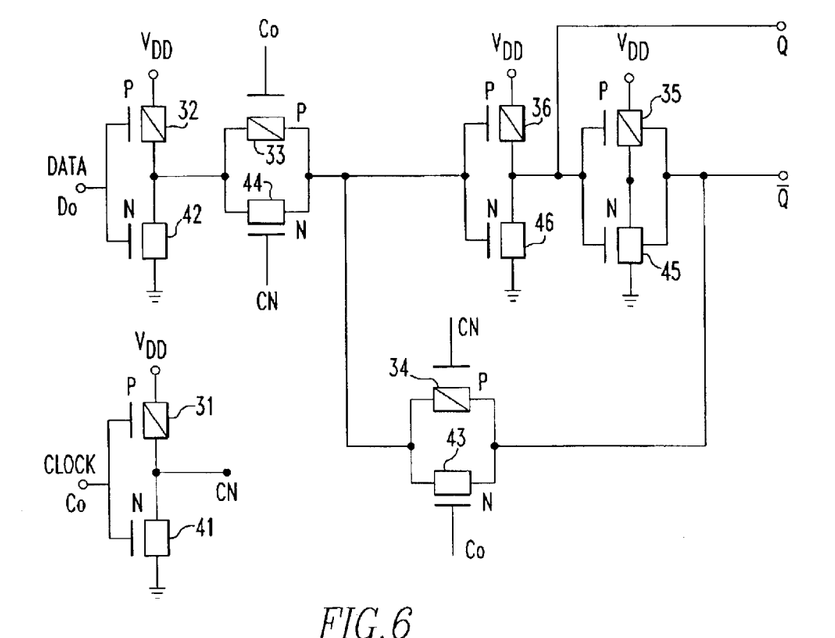
FIG. 6 is a transistor level circuit schematic of a D-Latch logic function.

In FIG. 6 a detailed circuit of a D-Latch function is illustrated. It includes NMOS pass transistors 43 and 44, PMOS transistors 33 and 34. The gate electrodes of these transistors are connected to clock C0 and clock complement CN as shown in FIG. 6. NMOS transistor 41 and PMOS transistor 31 make up the inverter that generates the clock complement CN from the clock input C0. The output of the inverter formed by transistor 35 and 45 is Q bar (complement of data), and output of the inverter formed by transistors 36, and 46 is Q (data). The operation of the D-Latch circuit is a well-known prior art.

Figure 7:
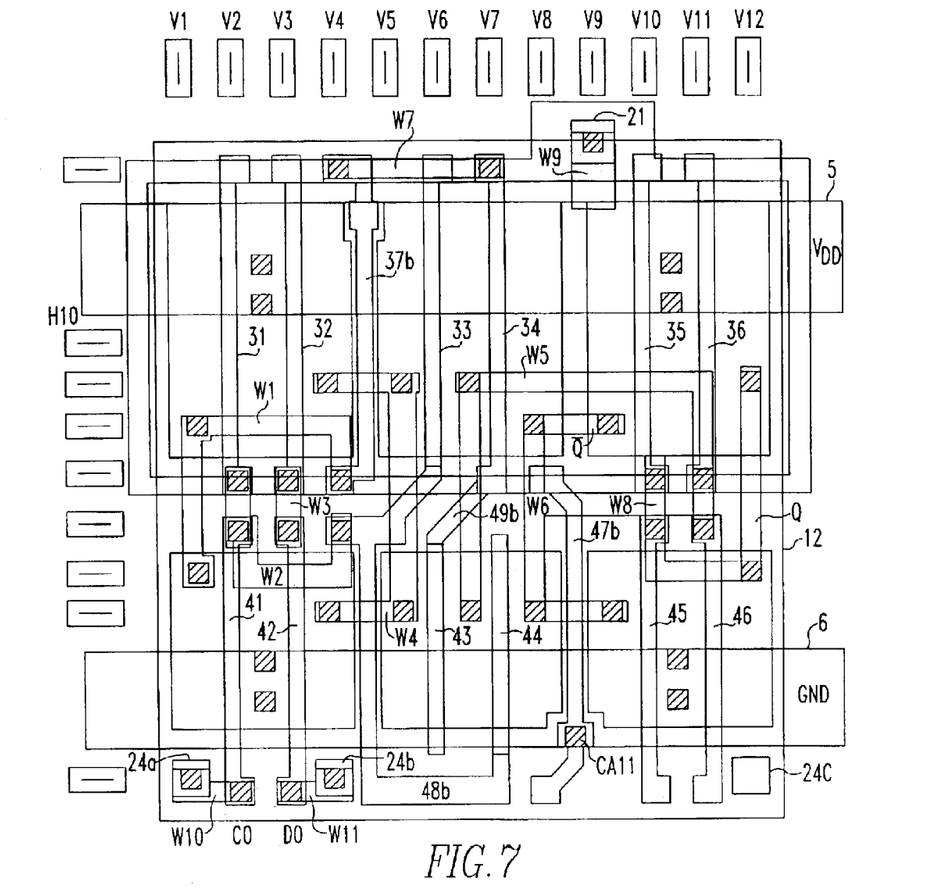
FIG. 7 is the D-Latch circuit layout using one gate array core cell of the present invention.

The layout of the D-Latch is implemented using the gate array cell 12 of the present invention and is illustrated in FIG. 7. The NMOS and PMOS transistors are interconnected with pre-placed polysilicon wires 37b, 48b, and 49b, and metal M1 wires w1 to w9. The gate electrode of transistor 33 is connected to the gate electrode of transistor 44 with polysilicon wire 48b. Similarly transistor 34 is connected to transistor 43 with polysilicon wire 49b. The most important features of the gate array cell include the pre-placed polysilicon wires 37b and 47b, that are used as needed. In D-Latch design polysilicon wire 37b and metal M1 wire, W7, are used to connect the clock complement CN, the output of the inverter, to gate electrodes of transistors 34 and 43. The interconnections are done at metal level only in the art of gate array ASIC design. It is obvious that pre-wired and pre-placed wires at polysilicon level serve the need of circuit function interconnections and reduce the need for metal M1 wires. This results in smaller cell area and higher circuit density. It also reduces parasitic capacitance, and results in higher circuit performance.

The second pre-placed polysilicon wire 47b is not used in this layout and is connected to ground bus with contact CA11 instead of letting it float. Wire 47b is used in other functions such as a DFF made up with two gate array core cells of this invention (not shown). Again the gate electrodes of transistors, source and drain areas of the transistors are connected to metal M1 via the contacts from polysilicon and diffusion levels to metal M1 shown as shaded square shapes under metal wires in FIG. 7.

The N-Well region in which PMOS transistors are formed is connected to the VDD bus 5 metal electrode by wire W9. Input clock C0 can be connected to ESD diode 24a and input D0 (data) to ESD diode 24b with wires w10 and w11 respectively. There are 5 possible input connection locations for C0 and 4 possible input connection locations for D0. Outputs Q and Qbar of this D-Latch are on metal wires w8 and w6 respectively. The VDD and GND buses make continuous connections horizontally from this cell to the next cell in the row of core cells on both right and left sides. These VDD and GND buses become part of the ASIC power supply and ground distribution network. Horizontal track H10 space is available for global (cell to cell) wiring for improved circuit density. The metal M1 wires and contacts needed for interconnections make up the personality layout graphics data of this function and is saved as a member in the ASIC library under the name of D-Latch cell.

Figure 8:
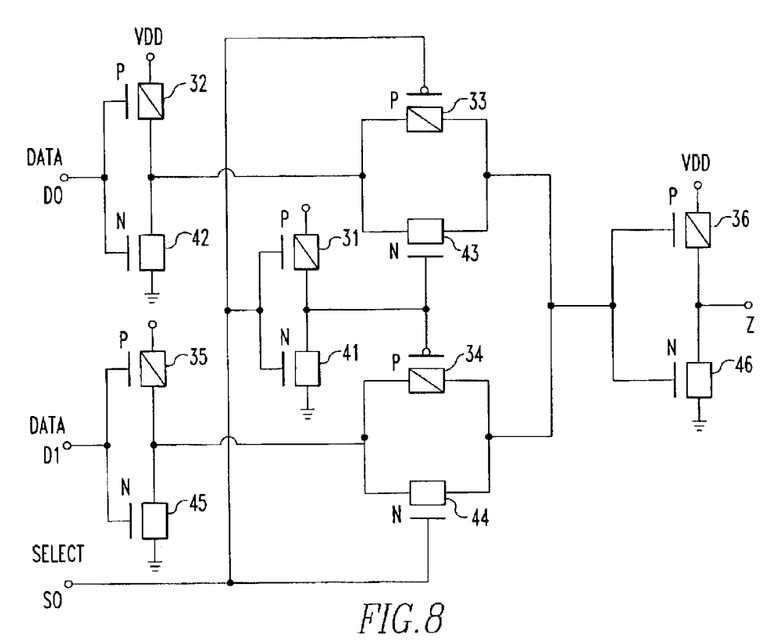
FIG. 8 is a transistor level circuit schematic of a 2:1 Multiplexer logic function.

Another example of a logic function very common in the ASIC devices is a multiplexer. In FIG. 8 a transistor level circuit schematic of a 2:1 multiplexer function is given. The interconnections of the transistors are shown. PMOS transistors 33 and 34, NMOS transistors 43 and 44 are used as pass transistors. When select signal S0 is low, it turns on pass transistors 33 and 43 and data D0 is selected. Whereas when select signal S0 is high it turns on transistors 34 and 44, and data D1 is selected. The circuit shows that the output inverter is implemented using transistors 36, and 46. The operation of a 2:1 multiplexer circuit is a well-known prior art.

Figure 9:
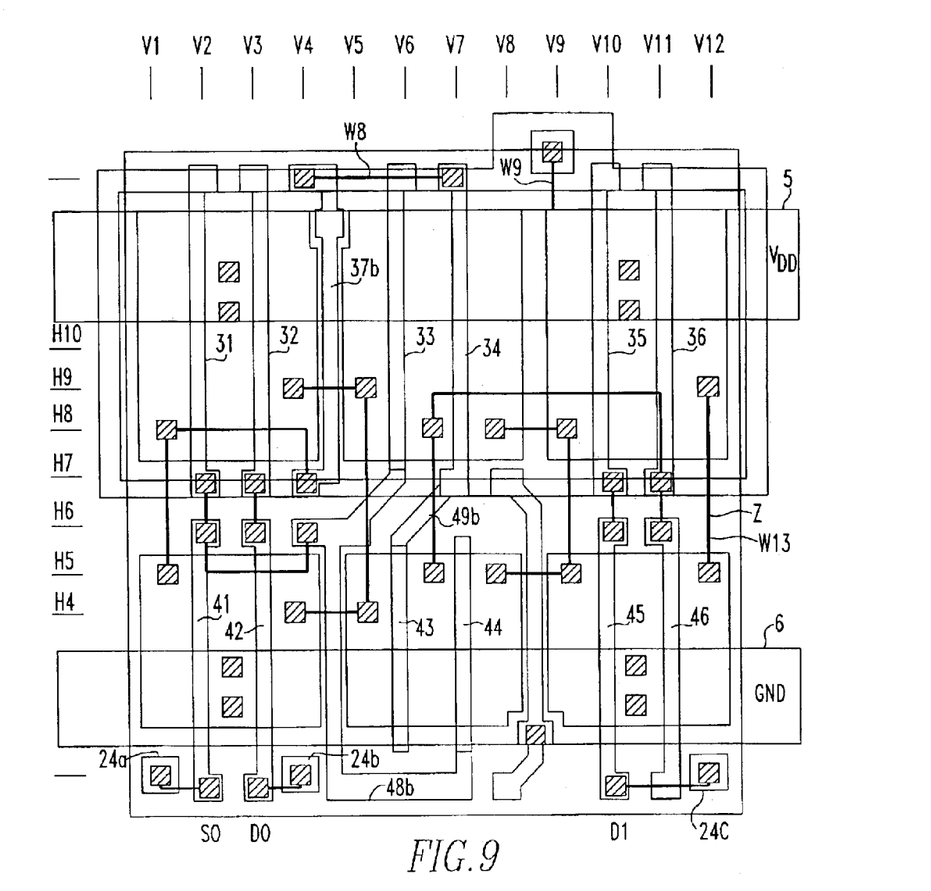
FIG. 9 is the layout of the 2:1 Multiplexer circuit using one gate array core cell of the present invention.

The physical layout of the 2:1 multiplexer circuit is implemented in one gate array core cell 12 of the present invention and is illustrated in FIG. 9. The interconnections of the transistors are accomplished using pre-defined polysilicon wires in the gate array core cell of the masterslice and metal M1 wires are added to complete the multiplexer circuit function. Usefulness of the pre-defined polysilicon wires connecting transistors 33 to 44 and connecting transistors 34 to 43 saves space otherwise will be needed if these interconnections were to be done at the metal level as is done in the prior art of the gate array ASIC designs. The pre-placed polysilicon wire 37b and M1 wire w8 are used to connect the output of inverter made up with transistors 31 and 41 to the gate electrodes of transistors 34 and 43. Pre-placed polysilicon wire 47b is not used in this layout and is connected to the GND bus via contact CA11, instead of letting it to float. The circuit function interconnections are completed with metal M1 wires and contacts between polysilicon or diffusion regions to metal M1 as shown in FIG. 9. Only center lines of the metal wires are shown in the layout.

The N-Well region in which PMOS transistors are formed is connected to the VDD bus metal with wire W9. Input select S0 pin can be connected to ESD diode 24a if needed (based on metal wire length between output diffusion region and the polysilicon gate electrode). Data inputs D0 and D1 are connected to the gate electrodes of transistors 32 and 42, 35 and 45 respectively. Select signal S0 can be connected to the gate electrodes of transistors 31 and 41 at five possible places. Other interconnections use metal M1 wires to complete the function. The output of the 2:1 multiplexer function is the output of the inverter formed with transistors 36 and 46. Their drain regions shorted together by metal M1 wire W13. Output 'Z' is on the metal M1 wire w13. The VDD bus 5 at metal M1 is connected to the source regions of the PMOS transistors using diffusion to metal contacts shown as shaded square shapes under the bus. Similarly source diffusion regions of the NMOS transistors are connected to the metal M1 GND bus 6. The VDD and GND buses make continuos connections horizontally from one cell to the next cell in the row of cells on both sides and eventually become part of the whole ASIC power supply (VDD) and ground (GND) network.

Horizontal wiring track H10 space is available to do global (cell to cell) wiring for improved ASIC wireability and get higher circuit density and somewhat smaller chip size. The metal M1 wires and contacts needed for interconnections make up the personality layout of this function.

Yet another category of digital functions, such as compiler based single and Dual Port SRAMs, register files, ROMs can be implemented in the gate array core cell 12 of this invention. The function of a dual port SRAM Bit is selected to show its implementation in this gate array cell. Single port SRAM Bit and Register File Bit designs are only subsets and are easier to implement in this cell.

Figure 10:
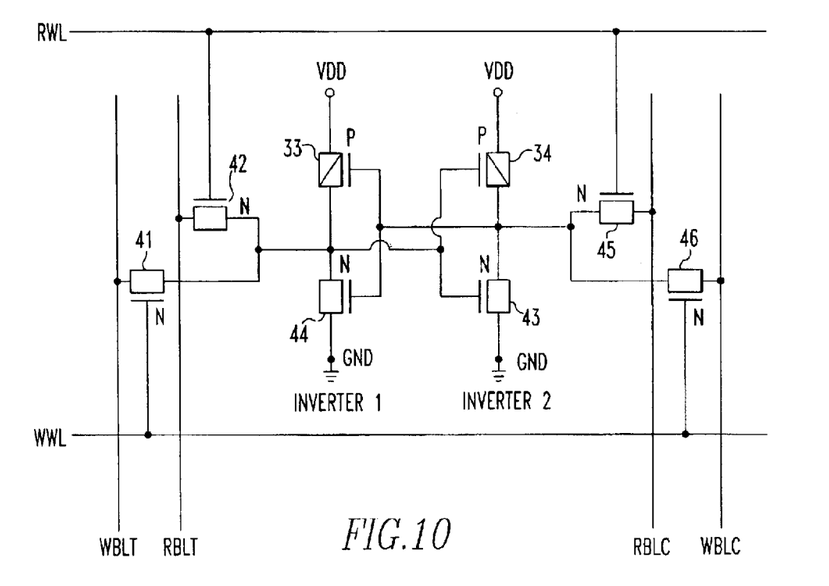
FIG. 10 is a transistor level circuit schematic of a Dual Port RAM (DPRAM) Bit. One DPRAM Bit takes one gate array core cell area.

The detailed circuit of a Dual Port SRAM (here after referred to as DPRAM) is illustrated in FIG. 10. In the circuit transistors 33,44 and 34,43 make up the inverters 1 and 2. The cross-coupled latch of the DPRAM bit consists of the inverters 1 and 2. NMOS transistors 42 and 45 are used as Read Word Line (RWL) pass transistors. Similarly NMOS transistors 41 and 46 are used as Write Word Line (WWL) pass transistors. Sources of transistors 41 and 46 (S/D region functions of a FET transistor are reversible and pass transistors are bi-directional for current flow) are connected to Write Bit Line True (WBLT) and Write Bit Line Complement (WBLC) respectively. In the same manner sources of transistors 42 and 45 are connected to Read Bit Line True (RBLT) and Read Bit Line Complement (RBLC) respectively. Other interconnections of this cell are connected as shown in FIG. 10. The DPRAM circuit is a prior art and the main purpose of presenting it in this invention is to show the versatility of this invention. This DPRAM bit becomes one of the cells in the DPRAM array. RAM Compilers in the gate array methodology have been designed in the prior art.

Figure 11:
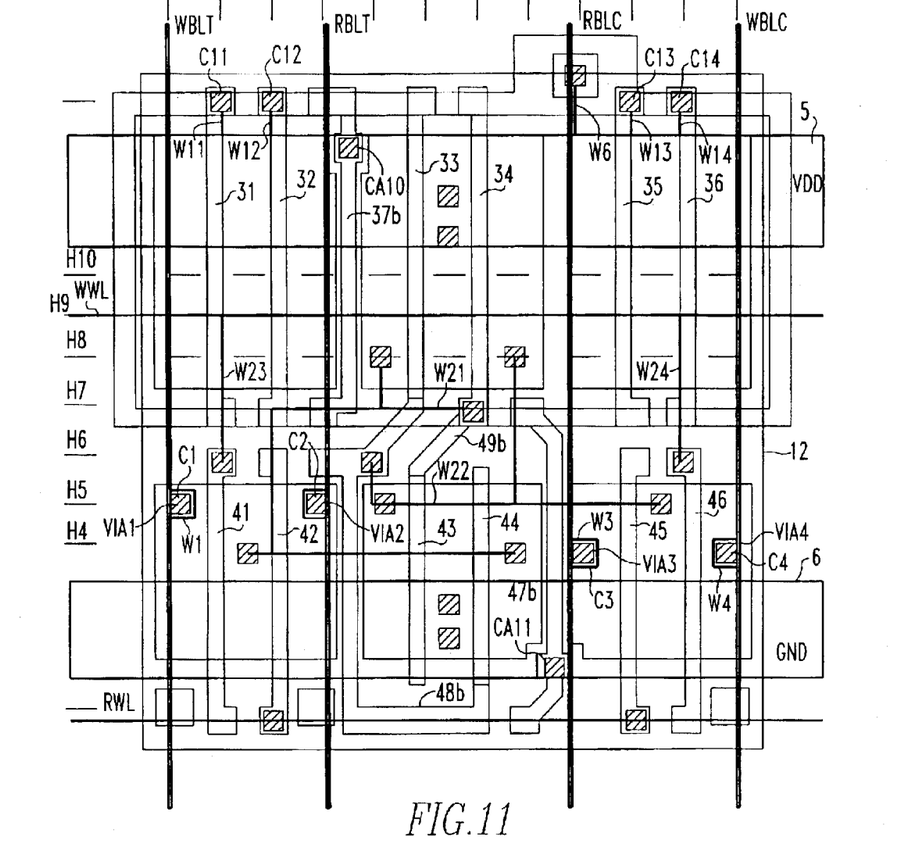
FIG. 11 is the layout of the DPRAM Bit, wherein the cell layout lends itself very well for an automated DPRAM memory block generator, also known as memory design compiler, and Read/Write word lines are at M1 in the horizontal direction and Read/Write Bit lines are at M2 in the vertical direction.

The physical layout of the DPRAM bit cell is implemented in one gate array core cell 12 of this invention and is illustrated in FIG. 11. The interconnections of the transistors are accomplished using predefined polysilicon wires 48b and 49b to make up the inverters 1 and 2 with transistors 33, 44 and 34, 43 respectively. Pre-placed polysilicon wires 37b and 47b are not used in this layout and are connected to VDD bus at CA10 and GND bus at CA11. Also in this function PMOS transistors 31, 32, 35, and 36 are not needed and their gate electrodes are connected to VDD bus 5 with metal M1 wires W11, W12, W13, and W14 via polysilicon to metal contacts C11, C12, C13, and C14 respectively. Power supply voltage VDD on the gates of these PMOS transistors will keep them in the off state. Write word line (WWL) and read word line (RWL) signals enter the cell at metal M1 horizontally and are connected to all the Write and Read pass transistors in the row of the DPRAM array in a continuos fashion. Only center lines of metal wires are shown in this layout.

The true and complement bit lines WBLT, RBLT, RBLC, and WBLC are drawn vertically at metal M2. The connections to the respective pass transistor sources are made from diffusion to metal M1 wires W1, W2, W3, W4 with contacts C1, C2, C3, C4. Metal M1 wires are connected to the metal M2 bit lines with Vias (Connections from M1 to M2) VIA1, VIA2, VIA3, and VIA4. Vias are stacked over the contacts. Rest of the interconnections in the DPRAM cell are formed with metal M1 wires W21, W22, W23, and W24.

N-Well region 15 in which PMOS transistors are formed is connected to the VDD bus metal with wire W6. The VDD and GND buses at metal M1 are connected to the sources of PMOS transistors and sources of NMOS transistors with contacts from diffusion to metal M1 shown as shaded square shapes under these buses. As in the logic area of the ASIC, VDD and GND buses make continuos connections horizontally to all cells in each row of the array and eventually are made part of the Power and Ground distribution network of the ASIC.

Wiring track H10 space is at M1 and is available for other wiring of the DPRAM array or for the ASIC global wiring as needed.

The complete DPRAM macro array is made up with the rows and columns of these cells to provide bits per word horizontally and number of words in the vertical direction. Other peripheral circuits, such as Clock drivers, Read/Write address decoders, Data drivers, drivers, Sense Amplifiers, output latches etc are also configured with the gate array core cell/cells of the present invention. Normally a Gate Array DPRAM macro compiler is developed to generate the design of all different sizes of the DPRAM macros. The compiler design is beyond the scope of this invention. Such compilers have been developed in the prior art. The compiler creates the personality of the DPRAM macros, which consists of contacts, metal M1, M1 to M2 Vias, and M2. The personality is saved in the library of the macro function as a member of the DPRAM macro set.

Even though gate array configured RAMs take more area than the standard cell RAM macros, but these can be developed using only BEOL processing steps, and save mask cost and processing time. Very large DPRAM macros are standard cell macros and are used as drop in memory macros.

Gate Array ASIC

The top view of an ASIC chip is illustrated in FIG. 12. Core region 100 consists of a large number of rows and columns of the gate array core cells. Cell boundaries butt against boundaries of the cells on left, right, top and bottom. The Input/Output Buffer cells are placed in the I/O region 101. The I/O buffer region is along the four edges of the ASIC chip. The compiler generated memory block or IP Core block can be placed on the chip as shown in FIG. 12. The large block has the width equal to the width of n core cells. Height of such a block is equal to the height of m core cells in a column. The wafers are processed through the FEOL process steps and are stocked for use to personalize individual Gate Array ASICs. The overall Gate Array ASIC design methodology is a well-known prior art in the semiconductor industry.

The invention can be used for implementing different categories of digital functions in the ASIC library from simple functions like NAND/AND to more complex combinatorial logic functions, DFF latch functions, and memory functional blocks or macros. This invention can accomplish complete functions of the Gate Array ASICs with the advantages of high circuit density, high performance, low power dissipation, while satisfying the normal advantages of gate array ASICs like lower cost and faster processing time.

The gate array cell described in this invention can also be used in the Standard cell ASICs as filler cells in spaces not occupied by the Standard Cells. Engineering changes to the Gate Array/Standard cell mixed ASICs can be made using the FEOL processed wafers of that particular ASIC with the gate array filler cells, and again saving on mask cost and process time after the engineering change. This invention describes specific functions' implementation in the CMOS technology. The Gate array core cell of this invention is readily applicable to other ASIC technologies such as SOS, SOI, BICMOS, and GAAS as well.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A gate array core cell comprising:
   a plurality of P+ diffusion regions formed in a N-well region, wherein at least some of the P+ diffusion regions are separated from other P+ diffusion regions by a silicon oxide layer;
   a plurality of PMOS transistors of identical dimensions which are formed in at least some of the P+ diffusion regions;
   a plurality of N+ diffusion regions formed on a p-type of wafer/chip substrate wherein said N+ diffusion regions are each separated from at least one of said other N+ diffusion regions by a silicon oxide layer; and
   a plurality of NMOS transistors of substantially identical dimensions which are formed in each of said N+ diffusion regions wherein the core cell includes PMOS transistor gate electrodes and there is pre-wiring of some of said PMOS transistor gate electrodes to a NMOS transistor gate electrodes at polysilicon level, which is the same level used to form the gate electrodes and pre-writing of said PMOS to NMOS transitor.

2. The gate array core cell of claim 1 wherein the core cell is divided into isolated N+ and P+ diffusion regions so that there is no need for diffusion isolation transistors.

3. The gate array core cell of claim 1 wherein the core cell is not connected to the PMOS and NMOS transistors that can be used as pass transistors or for forming logical circuit functions.

4. The gate array core cell of claim 1 wherein the core cell provides pre-placed polysilicon or local interconnect wires and said pre-placed wires are used to complete interconnections of different types of circuit functions whereby the use of said wires saves the need for metal wires and reduces cell size for higher circuit density.

5. The gate array core cell of claim 1 wherein there are means for connecting not used pre-placed polysilicon wires to a VDD bus or a GND bus within the cell area to avoid reliability concerns which otherwise will be associated if these wires are left floating.

6. The gate array core cell of claim 5 wherein the core cell provides for connecting the N-Well region to the VDD bus without impacting the cell size and hence the circuit density.

7. The gate array core cell of claim 1 wherein the core cell uses a minimum number of wire tracks for the horizontal interconnection wires in order to achieve higher circuit density.

8. The gate array core cell of claim 1 wherein the core cell is designed such that the overall X, Y dimensions are multiples of the M2, M3, M3, M4 wiring grid to reduce the global wiring complexity.

9. The gate array core cell of claim 1 wherein the core cell provides strategically placed ESD diodes on global wiring grid that can be used as needed.

10. The gate array core cell of claim 1 wherein the diffusion regions are separated by thick silicon oxide, such that it does not require isolation transistors, and the thick oxide isolation reduces parasitic capacitance of S/D regions and results in higher circuit performance.

11. The gate array core cell of claim 1 wherein by using pre-defined polysilicon wires and pre-placed polysilicon wires the cell reduces the need for interconnection wires at metal level, and metal wires for the remaining interconnections can be over these predefined and pre-placed polysilicon wires so that such wires are formed at the same time as the gate electrodes are formed and do not increase the cost or process time and such wires greatly reduce the cell size and increase the ASIC overall circuit density and smaller cell size in turn reduces the interconnection wire lengths, parasitic capacitance and increases the ASIC performance.

12. The gate array core cell of claim 1 wherein the cell can be stretched in the vertical direction to increase the width of the NMOS or PMOS or of both types of transistors along the horizontal track H4 or track H10 or along both the tracks respectively and wider transistors provide higher performance and optimum performance requirements can be achieved in designing the core cell for the masterslice wafers.

13. The gate array core cell of claim 1 wherein the gate array core cell is flexible for both high density logic functions, and for compiler based growable memory functions.

14. The gate array core cell of claim 1 wherein the core cell is compatible for complete ASIC interconnections from 3 levels of metal to larger number of interconnecting metal levels and as the number of metal levels are increased, the circuit density and performance will also increase.

15. The gate array core cell of claim 1 wherein the core cell architecture is independent of design ground rules' dimensions.

16. The gate array core cell of claim 1 wherein the gate array core cell is used with a design selected from a SOS, SOI, BICMOS, and GAAS gate array ASIC designs.

17. The gate array core cell of claim 1 wherein gate electrodes are found with a local interconnect level during BEOL process steps that will provide added flexibility of using pre-wiring only in the circuits needed and reduce parasitic capacitance in the other circuits.

18. A gate array core cell comprising:
a plurality of P+ diffusion regions formed in a N-well region, wherein at least some of the P+ diffusion regions are separated from other P+ diffusion regions by a silicon oxide layer;
a plurality of PMOS transistors of identical dimensions which are formed in at least some of the P+ diffusion regions;
a plurality of N+ diffusion regions formed on a p-type of wafer/chip substrate wherein said N+ diffusion regions are each separated from at least one of said other N+ diffusion regions by a silicon oxide layer; and
a plurality of NMOS transistors of substantially identical dimensions which are formed in each of said N+ diffusion regions, wherein the core cell is divided into isolated N+ and P+ diffusion regions so that there is no need for diffusion isolation transistors and the core cell includes PMOS transistor gate electrodes and there is pre-wiring of some of said PMOS transistor gate electrodes to a NMOS transistor gate electrodes at polysilicon level, which is the same level used to form the gate electrodes and pre-wiring of said PMOS to NMOS transistors.

19. A gate array core cell comprising
a plurality of P+ diffusion regions formed in a N-well region, wherein at least some of the P+ diffusion regions are separated from other P+ diffusion regions by a silicon oxide layer;
a plurality of PMOS transistors of identical dimensions which are formed in at least some of the P+ regions;
a plurality of N+ diffusion regions formed on a p-type of wafer/chip substrate wherein said N+ diffusion regions are each separated from at least one of said other N+ diffusion regions by a silicon oxide layer; and
a plurality of NMOS transistors of substantially identical dimensions which are formed in each of said N+ diffusion regions wherein the core cell is not connected to the PMOS and NMOS transistors that can be used as pass transistors or for forming logical circuit functions.

20. A gate array cell comprising:
a plurality of P+ diffusion regions formed in a N-well region, wherein at least some of the P+ diffusion regions are separated from other P+ diffusion regions by a silicon oxide layer;
a plurality of PMOS transistors of identical dimensions which are formed in at least some of the P+ diffusion regions;
a plurality of N+ diffusion regions formed on a p-type of wafer/chip substrate wherein said N+ diffusion regions are each separated from at least one of said other N+ diffusion regions by a silicon oxide layer; and
a plurality of NMOS transistors of substantially identical dimensions which are formed in each of said N+ diffusion regions wherein the core cell provides pre-placed polysilicon or local interconnect wires and said pre-placed wires are used to complete interconnections of different types of circuit functions whereby the use of said wires saves the need for metal wires and reduces cell size for higher circuit density.

* * * * *